United States Patent
Rinzler et al.

(10) Patent No.: US 8,232,561 B2
(45) Date of Patent: Jul. 31, 2012

(54) NANOTUBE ENABLED, GATE-VOLTAGE CONTROLLED LIGHT EMITTING DIODES

(75) Inventors: Andrew Gabriel Rinzler, Newberry, FL (US); Bo Liu, Gainesville, FL (US); Mitchell Austin McCarthy, Gainesville, FL (US); John Robert Reynolds, Gainesville, FL (US); Franky So, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 212 days.

(21) Appl. No.: 12/677,457

(22) PCT Filed: Sep. 10, 2008

(86) PCT No.: PCT/US2008/075866
§ 371 (c)(1),
(2), (4) Date: May 12, 2010

(87) PCT Pub. No.: WO2009/036071
PCT Pub. Date: Mar. 19, 2009

(65) Prior Publication Data
US 2010/0237336 A1     Sep. 23, 2010

Related U.S. Application Data (63) Continuation-in-part of application No. PCT/US2007/072501, filed on Jun. 29, 2007.

(60) Provisional application No. 60/971,147, filed on Sep. 10, 2007, provisional application No. 61/085,670, filed on Aug. 1, 2008, provisional application No. 60/817,521, filed on Jun. 29, 2006.

(51) Int. Cl.
| H01L 29/06  | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15  | (2006.01) |
| H01L 29/18  | (2006.01) |
| H01L 31/12  | (2006.01) |
| H01L 33/00  | (2010.01) |
| H01L 29/26  | (2006.01) |

(52) U.S. Cl. ......... 257/79; 257/13; 257/87; 257/E29.07; 977/701; 977/742; 977/762; 977/767; 977/932; 977/936; 977/937; 977/938

(58) Field of Classification Search ................. 257/13, 257/87, 79, E29.07; 977/701, 742, 762, 767, 977/932, 936, 937, 938
See application file for complete search history.

(56) References Cited

U.S. PATENT DOCUMENTS 7,115,916 B2 * 10/2006 Avouris et al. ................. 257/103
(Continued)

OTHER PUBLICATIONS

The International Search Report and Written Opinion dated May 8, 2009.
(Continued)

Primary Examiner — Ida M Soward
(74) Attorney, Agent, or Firm — Thomas, Kayden, Horstemeyer & Risley, LLP (57) ABSTRACT

Embodiments of the invention relate to vertical field effect transistor that is a light emitting transistor. The light emitting transistor incorporates a gate electrode for providing a gate field, a first electrode comprising a dilute nanotube network for injecting a charge, a second electrode for injecting a complementary charge, and an electroluminescent semiconductor layer disposed intermediate the nanotube network and the electron injecting layer. The charge injection is modulated by the gate field. The holes and electrons, combine to form photons, thereby causing the electroluminescent semiconductor layer to emit visible light. In other embodiments of the invention a vertical field effect transistor that employs an electrode comprising a conductive material with a low density of states such that the transistors contact barrier modulation comprises barrier height lowering of the Schottky contact between the electrode with a low density of states and the adjacent semiconductor by a Fermi level shift.

17 Claims, 10 Drawing Sheets

U.S. PATENT DOCUMENTS

| | | | | |
|---|---|---|---|---|
| 7,323,730 | B2* | 1/2008 | Borghetti et al. | 257/290 |
| 7,359,888 | B2* | 4/2008 | Snider | 706/26 |
| 7,439,562 | B2* | 10/2008 | Auvray et al. | 257/253 |
| 7,473,922 | B2* | 1/2009 | Uchiyama et al. | 257/14 |
| 7,538,337 | B2* | 5/2009 | Hijzen et al. | 257/3 |
| 7,545,051 | B2* | 6/2009 | Yang et al. | 257/784 |
| 7,545,241 | B2* | 6/2009 | Wakabayashi et al. | 333/238 |
| 8,022,432 | B2* | 9/2011 | Yi et al. | 257/99 |
| 2004/0197546 | A1 | 10/2004 | Rinzler et al. | |
| 2006/0145144 | A1 | 7/2006 | Lee et al. | |
| 2006/0243971 | A1 | 11/2006 | Iechi | |
| 2006/0263255 | A1* | 11/2006 | Han et al. | 422/83 |
| 2006/0284230 | A1 | 12/2006 | Yang et al. | |
| 2010/0123120 | A1* | 5/2010 | Mohseni | 257/21 |
| 2010/0148183 | A1* | 6/2010 | Ward et al. | 257/76 |
| 2010/0155696 | A1* | 6/2010 | Duan et al. | 257/14 |

OTHER PUBLICATIONS

The International Preliminary Report on Patentability dated Nov. 25, 2010.

Al-Ibrahim, M. et al., "The influence of the optoelectronic properties of poly(3-alkylthiophenes) on the device parameters in flexible polymer solar cells," *Organic Electronics*, 2005, pp. 65-77, vol. 6.

Asadi, K. et al., "Manipulation of charge carrier injection into organic field-effect transistors by self-assembled monolayers of alkanethiols," *Journal of Materials Chemistry*, 2007, pp. 1947-1953, vol. 17.

Forsythe, E.W. et al., "Interface analysis of naphthyl-substituted benzidine derivative and tris-8-(hydroxyquinoline) aluminum using ultraviolet and x-ray photoemission spectroscopy," *Journal of Vacuum Science Technology*, 1999, pp. 3429-3432, vol. 17, No. 6.

Jou, J-H. et al., "Efficient pure-white organic light-emitting diodes with a solution-processed, binary-host employing single emission layer," *Applied Physics Letters*, 2006, pp. 141101-1 to 14101-3, vol. 88.

Lee, K. et al., "Single Wall Carbon Nanotubes for p-Type Ohmic Contacts to GaN Light-Emitting Diodes," *Nano Letters*, 2004, pp. 911-914, vol. 4, No. 5.

Li, S-H. et al., "Achieving ambipolar vertical organic transistors via nanoscale interface modification," *Applied Physics Letters*, 2007, pp. 083507-1 to 083507-3, vol. 91.

Lonergan, M.C., "A Tunable Diode Based on an Inorganic Semiconductor | Conjugated Polymer Interface," *Science*, Dec. 1997, pp. 2103-2106, vol. 278.

Ma, L. et al., "Unique architecture and concept for high-performance organic transistors," *Applied Physics Letters*, Nov. 22, 2004, pp. 5084-5086, vol. 85, No. 21.

Unalan, H.E. et al., "Design Criteria for Transparent Single-Wall Carbon Nanotube Thin-Film Transistors," *Nano Letters*, 2006, pp. 677-682, vol. 6, No. 4.

Wu, Z. et al., "Transparent, Conductive Carbon Nanotube Films," *Science*, Aug. 27, 2004, pp. 1273-1276, vol. 305.

* cited by examiner

*Prior art*

NANOTUBE ENABLED, GATE-VOLTAGE CONTROLLED LIGHT EMITTING DIODES

CROSS-REFERENCE TO RELATED APPLICATIONS

This application is the U.S. national stage application of International Patent Application No. PCT/US2008/075866, filed Sep. 10, 2008, which claims the benefit of U.S. Provisional Application Ser. No. 60/971,147, filed Sep. 10, 2007, claims the benefit of U.S. Provisional Application Ser. No. 61/085,670, filed Aug. 1, 2008, and is a continuation-in-part of International Application No. PCT/US2007/072501, filed on Jun. 29, 2007, which claims the benefit of U.S. Provisional Application No. 60/817,521, filed on Jun. 29, 2006, all of which are hereby incorporated by reference herein in their entirety, including any figures, tables, or drawings.

BACKGROUND OF THE INVENTION

Light-emitting transistors combine the visible light emission properties of light emitting diodes (LEDs) with the switching properties of transistors. As driving elements, lateral- (e.g., field effect transistor (FET)) and vertical—(e.g., static induction transistor) type transistors have been proposed. Lateral-type transistors using a standard FET structure require a high drive voltage due to factors such as a relatively long channel length, low luminance efficiency, and small aperture ratio. Vertical-type transistors using an organic static induction transistor have relatively high currents and high speeds with low operational voltages, but the fabrication of a fine gate structure has been conventionally required to achieve a high on/off ratio.

In conventional nanotube network based field effect transistors, the nanotube network is directly contacted on two sides by metallic source and drain electrodes. To observe a significant gate induced modulation of the current through the nanotubes, between the source-drain electrodes, the surface density of the conventional nanotube network needs to lie very close to its percolation limit. This is because the nanotubes of the networks of field effect transistors are a mixture of semiconducting and metallic nanotubes, while only the carrier density of the semiconducting nanotubes are appreciably modulated by the gate field. If the nanotube surface density lies well above the percolation threshold, there are numerous purely metallic nanotube current pathways between the source and drain electrodes. This results in substantial source-drain current even when the gate field modulates the semiconducting nanotubes to minimize their conductance (the "off" state). When the gate field maximizes the semiconducting nanotube conductance (the "on" state), the overall source-drain conductance does increase. However, if the nanotube surface density is well above the percolation threshold, the increase in the "on" state current is only a fraction of the "off" state current. It is only when the nanotube surface density is very near the percolation threshold and the great majority of what would otherwise be purely metallic nanotube current pathways are interrupted by semiconducting nanotubes that the "on" state current can be orders of magnitude greater than the "off" state current.

Thin film transistors (TFTs) provide the drive circuitry for present and emerging active matrix displays including liquid-crystal and organic-light-emitting display technologies. The dominant active semiconductor in these devices is amorphous silicon, however the promise of inexpensive, solution based processing techniques, inkjet patterning and construction on flexible plastic substrates has focused much research over the past 20 years on organic semiconductors as replacements. There now exist a broad range of small molecule organic and polymeric compounds that have demonstrated transconductance. Unfortunately, the electronic mobilities of these compounds, which were initially about 5-6 orders of magnitude too low to be commercially useful, remain about an order of magnitude too low. Such low mobility can be compensated for by bringing the source and drain electrodes closer together, reducing the semiconductor channel length ($C_L$ in FIG. 7A), but that greatly raises the cost of patterning the devices, removing much of the motivation.

A new TFT architecture was disclosed in Ma et al., *Appl. Phys. Lett.* 2004, 85, 5084, to circumvent mobility limitations of present organic semiconductors. The device relies on an ultra thin (<20 nm) aluminum source electrode that required careful partial oxidation. While the optimized device exhibited ~6 orders of magnitude current modulation, the low work function aluminum source electrode required an n-type active channel, restricting that device to the use of $C_{60}$ as the channel material. Li et al., *Appl. Phys. Lett.* 2007, 91, 083507 disclosed the use of the organic semiconductor pentacene; but requires an additional 7 nm vanadium oxide layer atop the partially oxidized aluminum source electrode. As forming a partly oxidized, ultra thin aluminum source electrode is difficult to produce commercially, constrains the choice of the organic active layers, and is susceptible to electromigration; hence, limiting the device lifetime other modes of forming an electrode that does not shield the gate field is desired. Thus, there remains a need for a light emitting transistor that is easy and efficient to manufacture and can use a simplified electronics drive scheme at low operational voltages, thereby requiring less energy consumption and providing for a longer and more reliable device lifetime.

BRIEF SUMMARY

Embodiments of the invention relate to a light emitting transistor that incorporates a gate electrode for providing a gate field, a first electrode comprising a dilute nanotube network for injecting charges (holes or electrons), an a second electrode for injecting a complementary charge (electrons or holes, respectively), and an electroluminescent semiconductor layer disposed intermediate the nanotube network and the electron injecting layer. For example, the hole injection can be modulated by the gate field. The holes and electrons combine to form photons, thereby causing the electroluminescent semiconductor layer to emit visible light.

Embodiments of the invention allow facile modulation of the electronic contact-barrier across the junction between single wall carbon nanotubes (SWNTs) and two distinct organic semiconductors. Specific embodiments relate to two devices: a vertical field effect transistor and a vertical light emitting transistor. The vertical architecture, which is readily facilitated by the specific properties of the nanotubes, allows the use of low mobility semiconductors that would otherwise be considered unsuitable for field effect transistors. For the light emitting transistor, the gate control permits new pixel drive schemes and increased device lifetimes.

BRIEF DESCRIPTION OF DRAWINGS

The figures may not be drawn to scale. Moreover, where directional terms (such as above, over, left, right, under, below, etc.) are used with respect to the illustrations or in the discussion, they are used for ease of comprehension only and not as limitations. The elements of the devices may be oriented otherwise, as readily appreciated by those skilled in the art.

FIG. 7A shows that a short channel length, $C_L$, in the standard TFT requires tight patterning of the source and drain electrodes, an issue circumvented in the VFET. The current in the standard TFT scales with the channel width $C_W$, while in the VFET this scales with the overlap area between the source and drain electrodes, $C_A$.

FIG. 8A shows source-drain current as a function of gate voltage for both material systems. PF-9HK devices have noticeably larger hysteresis than the NPD devices. Arrows indicate the gate voltage sweep direction. FIG. 8B shows output curves for the PF-9HK VFET, and FIG. 8C shows NPD VFET at the gate voltage specified adjacent each curve.

DETAILED DISCLOSURE

Embodiments of the invention are directed to light emitting transistors that have a gating electric field to control electronic transport between a first electrode comprising a dilute nanotube network and an electroluminescent semiconducting layer. The nanotube network includes open spaces that allow for penetration of the gate field into an electroluminescent layer. The gate field controls the current injection into the electroluminescent layer and thereby the visible light output from the device. Suitable applications of this technology include lighting, displays and signs, for example.

Figure 1:
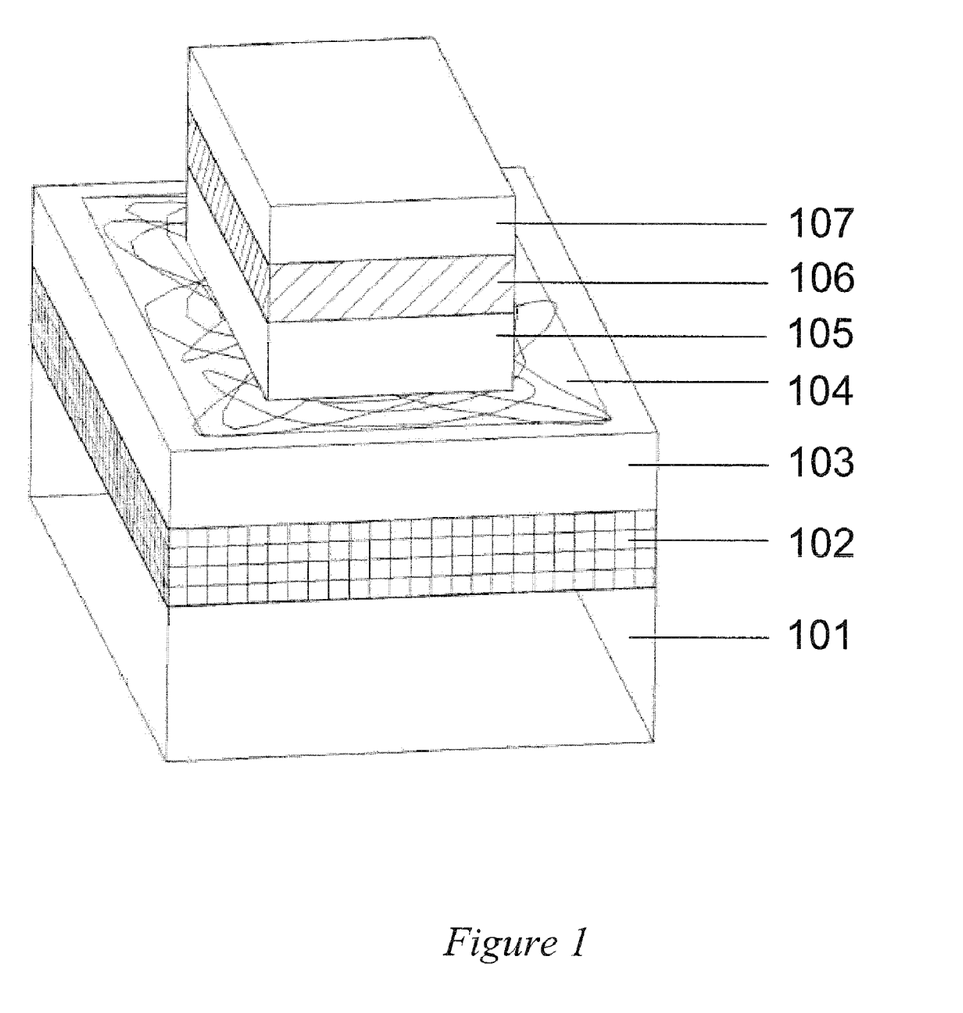
FIG. 1 shows an exemplary embodiment of a device of the present disclosure.

A gating electric field is used to modulate the barrier to electronic transport between a dilute nanotube network and a semiconducting layer by controlling current injection into the semiconducting layer. If the semiconducting layer is an electroluminescent material, the device becomes a gate-voltage controlled light emitting diode (GLED), also termed a light emitting transistor. FIG. 1 shows a device according to an exemplary embodiment of the invention. Such an embodiment includes a transparent substrate layer 101. Layer 102 is a transparent gate electrode topped by an insulating, gate dielectric layer 103. The curved lines drawn on top of the gate dielectric layer represent the first electrode comprising a dilute nanotube network 104. This is coated with the electroluminescent material layer 105, followed by a second electrode 106 and a protecting electrode layer 107, where, for example, in many embodiments of the invention, the first electrode injects holes and the second electrode injects electrons. It should be understood that devices of alternate embodiments of the invention comprise a first electrode to inject electrons and the second electrode to inject holes. In general, embodiments of the invention are described herein for hole injecting first electrodes and electron injecting second electrodes, although those skilled in the art can envision devices with the converse structure.

In one embodiment, the nanotube network 104 is made electrically positive with respect to the electron injecting layer 106 and protecting electrode layer 107. Holes injected from the nanotube network 104 and electrons injected from the second electrode 106 combine in the electroluminescent layer 105 to produce photons. The high aspect ratio (length to diameter) of the nanotubes allows the network to be electrically percolating (electrically interconnected), but simultaneously dilute, thereby possessing substantial open spaces between the nanotubes. As used herein, a dilute nanotube network is one that has sufficient open spaces to permit some contact between the active layer, such as the electroluminescent material layer 105 and the gate dielectric layer 103. These open spaces admit penetration of the gate field into the electroluminescent layer 105 without the full electrostatic screening that would be caused by a contiguous electrode in place of the nanotube network. The gate field modulates the carrier density in the electroluminescent material 105 in the vicinity of the nanotubes, and on the nanotubes, thereby modifying the barrier to hole transport between the two materials. The gate field thus controls the hole injection into the electroluminescent layer 105 and thereby controls the light output from the device.

Figure 2:
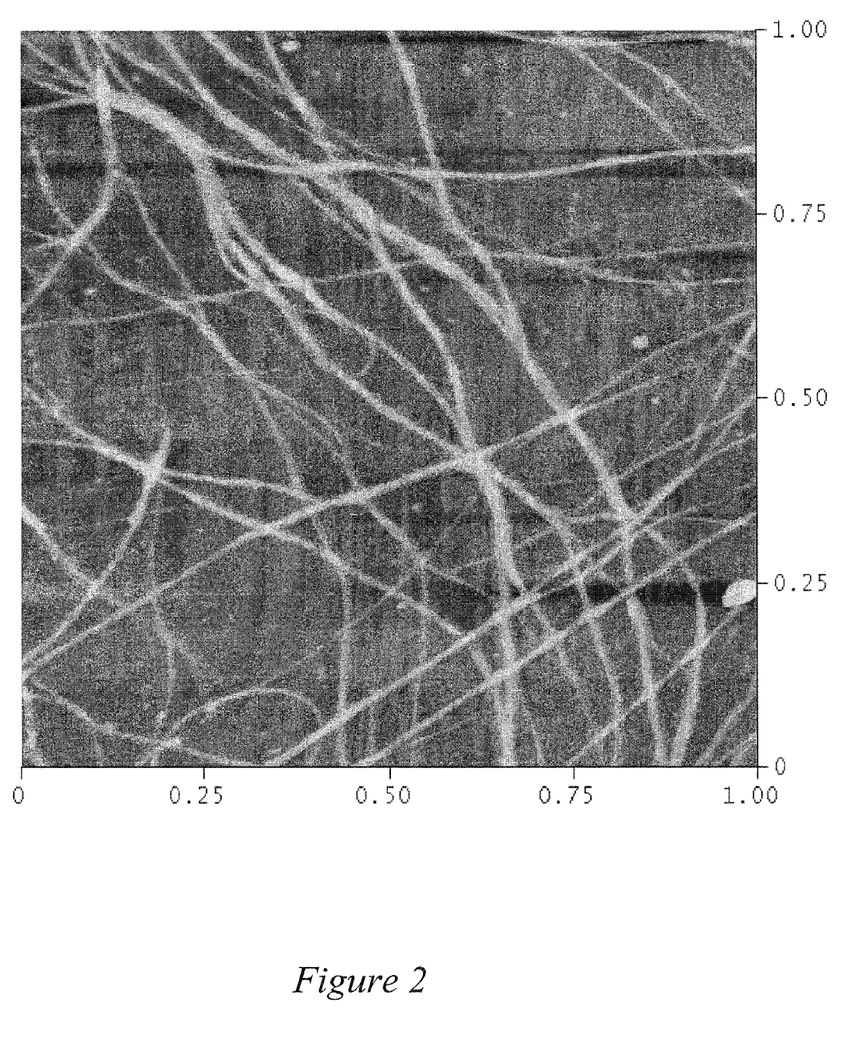
FIG. 2 shows an atomic force microscopy (AFM) image of an exemplary embodiment of a dilute nanotube network on top of a silicon wafer, with a scale of 1×1 micron.

Dilute nanotube networks that are electrically percolating are readily fabricated by the method described in U.S. Patent Application Publication No. US 2004/0197546 (the '546 application), which teaches the fabrication of dilute nanotube networks that are electrically percolating. FIG. 2 shows an atomic force microscopy (AFM) image of an exemplary embodiment of a dilute nanotube network 104 on top of a silicon wafer, including open spaces between electrically interconnected nanotubes. The fabrication method described in the '546 application permits fine control over the surface density of the nanotubes making up the network 104 so as to allow fine control of the fraction of open space between the nanotubes. The nanotube surface density that optimizes device operation depends on the characteristics of the electroluminescent material and is determined experimentally.

Figure 3:
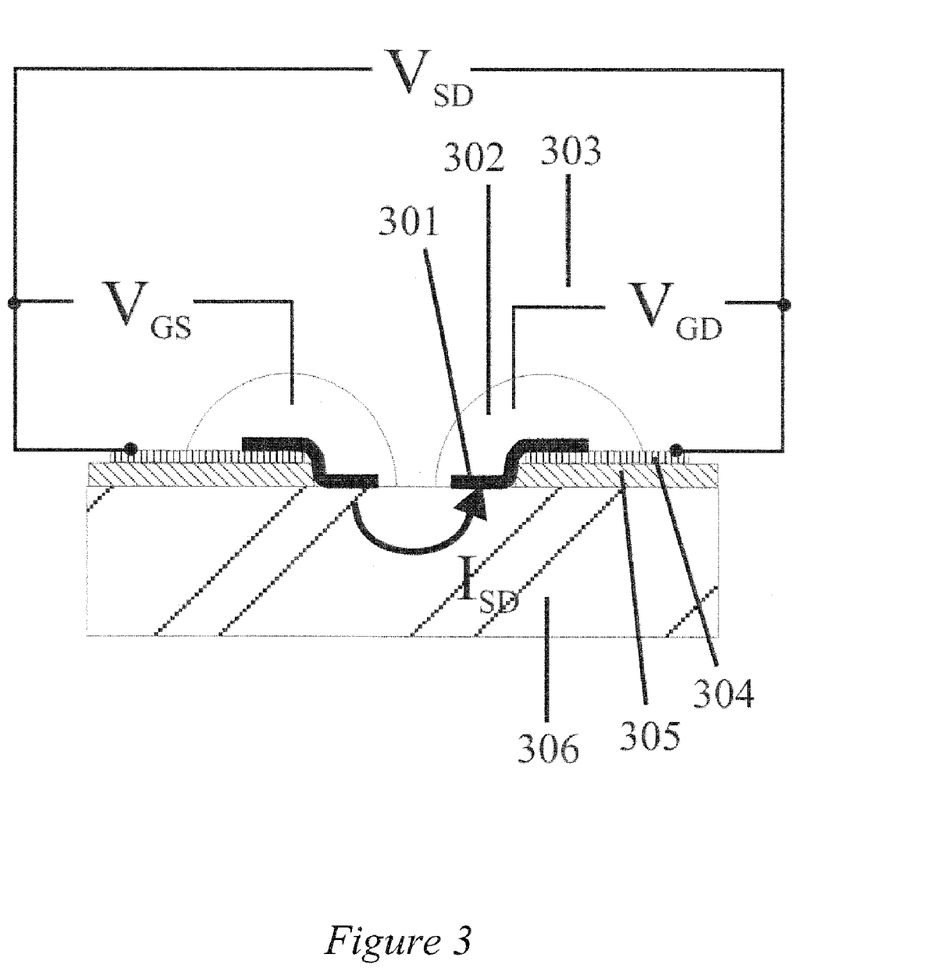
FIG. 3 is an exemplary embodiment of a device of the present disclosure during an experiment in which the gate field is provided by an ionic liquid and the semiconductor is p-doped silicon.

Modulation of hole-injection by the gate field of a contact barrier at the nanotube semiconductor interface was demonstrated as shown in FIG. 3, which is an exemplary device according to an embodiment of the invention in which the gate field is provided by an ionic liquid rather than a conductive electrode with a gate dielectric layer, and where the semiconductor is p-doped silicon. The device is symmetric about its vertical midline so only one of each repeated element is labeled. Layer 305 is a 600 nm insulating oxide layer that has been etched away from the middle portion of the p-doped silicon substrate layer 306. Palladium electrodes 304, which are pre-deposited onto the oxide layer, provide electrical contact to the nanotube networks 301. The nanotube networks 301 are draped across the contact electrode 304 and down onto the bare silicon 306 to provide intimate contact between the nanotubes 301 and the silicon 306. Separate ionic liquid drops 302 saturate each nanotube network 301. The nanotube network 301 on the left is designated as the source and the network 301 on the right is designated as the drain. The nanotube networks 301 on each side are not physically connected to each other; they are separated at their point of closest approach by approximately 1 cm. A small potential, $V_{SD}$, is applied between the source and drain networks (via the electrodes 304) and the current $I_{SD}$ measured. The current path goes through the silicon and therefore through the nanotube-silicon interface on each side. Separate power supplies apply gate potentials to each interface between nanotube network 301 and Si substrate 306 via the ionic liquid drops 302. These power supplies connect electrically on one side to the nanotube networks 301 (via Pd electrode 304) and on the other side to a counter electrode 303 contacting only the ionic liquid 302.

Figure 4:
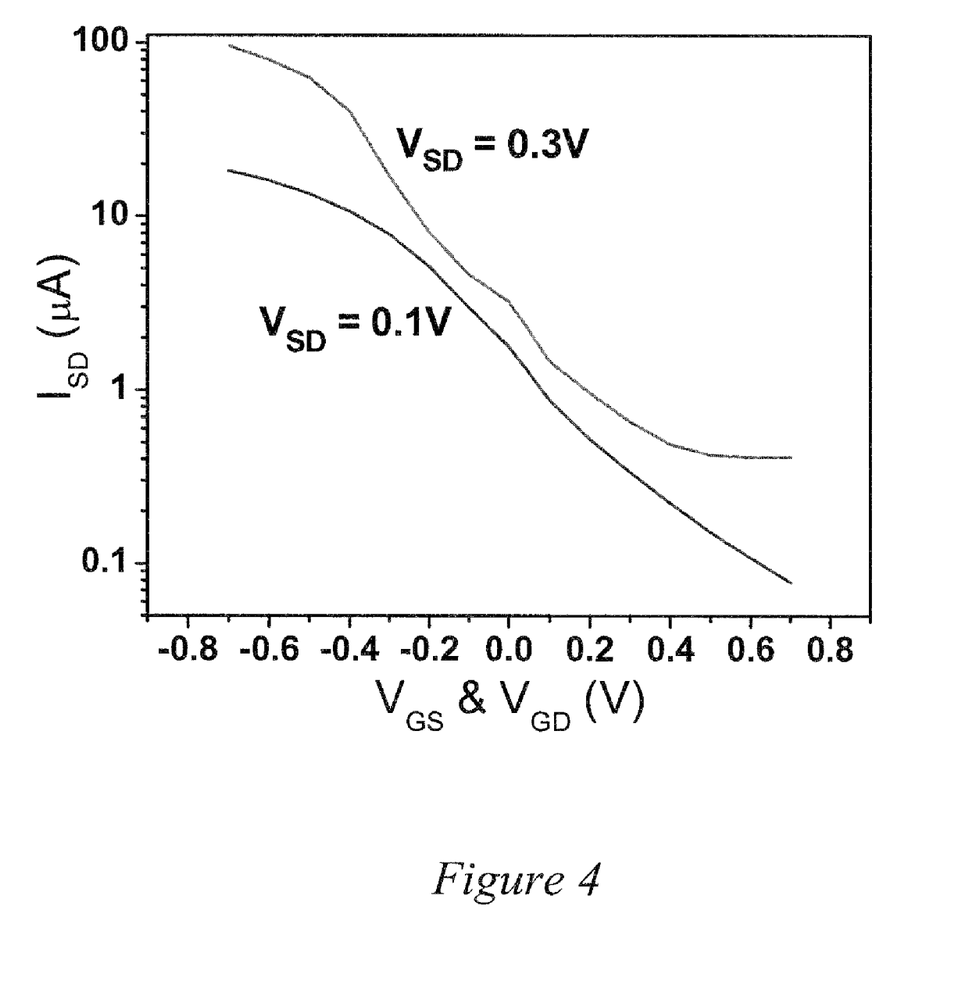
FIG. 4 shows the modulation in $I_{SD}$ with the same gate voltage applied to each nanotube network-silicon interface for two different source drain potentials of 0.1 and 0.3 volts.

FIG. 4 shows the modulation in $I_{SD}$ with the same gate voltage applied to each nanotube network-silicon interface for two different source drain potentials of 0.1 and 0.3 volts. The gate voltages clearly modulate the transport barriers across each interface. The logarithmic current scale presents the magnitude of the modulation. In the embodiment of FIG. 3, the nanotube networks are thicker than shown in FIG. 2 and have a much larger surface density than shown in FIG. 2. Nevertheless, the porosity of the network 301 and the fluidity of the ionic liquid gate electrode allow access to the nanotube network-silicon interface on each side to enable the effect.

The current modulation described here and below should not be confused with that seen in conventional nanotube network based field effect transistors. The nanotube networks of the present disclosure do not lie as close to the percolation limit as conventional nanotube networks for conventional nanotube network based field effect transistors. For specific embodiments of the subject invention, direct modulation of the nanotube network conductance contributes only a small fraction to the overall modulation produced.

Figure 5:
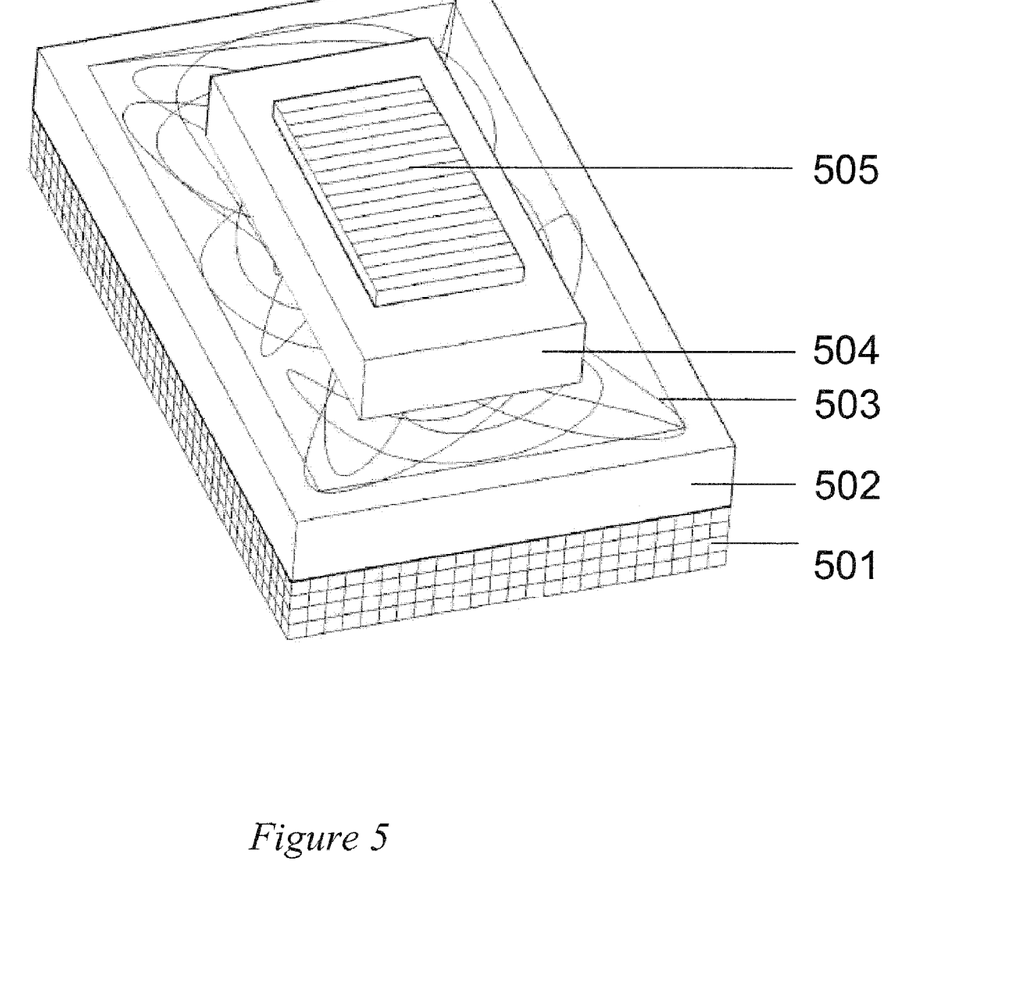
FIG. 5 is a partial cross sectional view of a second exemplary embodiment of a device of the present disclosure.

Another embodiment of the invention has device geometry as that in FIG. 5, where the nanotube network has a surface density as exemplified in FIG. 2. FIG. 5 illustrates a second exemplary embodiment of a device of the present invention. In this case, the dilute nanotube network 503 (represented by the curved lines) lies on top of a 200 nm thick, gate-dielectric $SiO_x$ layer 502 on a p-doped Si substrate 501 that acts as the gate electrode. The active semiconductor layer 504 is a electroluminescent polymer, which, in an exemplary embodiment, is poly[(9,9-dioctylfluorenyl-2,7-diyl)-co-(9-hexyl-3,6-carbazole)] (PF-9HK). The top contact is a platinum electrode layer 505. This differs from the device of FIG. 1 in that the Fermi level of platinum lies much closer to the highest occupied molecular orbital (HOMO) of the polymer rather than its lowest unoccupied molecular orbital (LUMO). Without electron injection into the LUMO, the device is a so-called "hole only" device (transport in the polymer is restricted to the HOMO) and does not emit light, obviating the need for transparency of the gate layer and substrate of FIG. 1. This construction is useful for demonstrating the efficacy of the gate in modulating the contact barrier across the nanotube-polymer interface.

Figure 6:
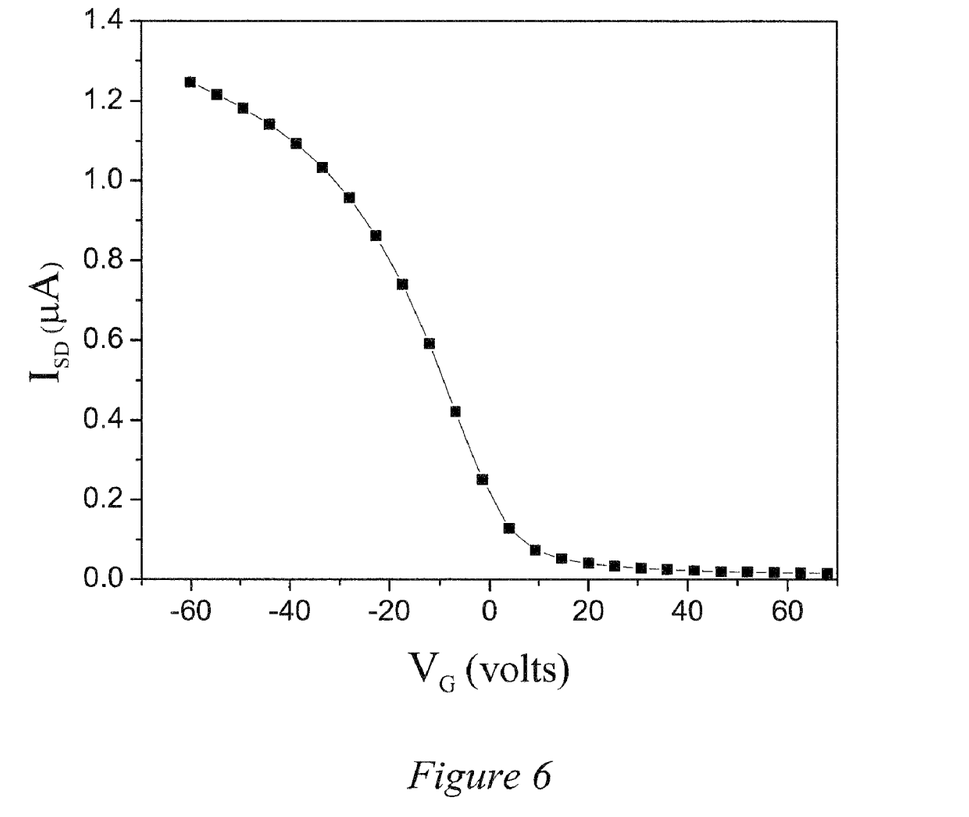
FIG. 6 shows the transfer curve for the device of FIG. 5.

FIG. 6 shows the transfer curve for the device of FIG. 5. The gate potential induces a two order of magnitude change in the source-drain (nanotube-platinum electrode) current. The large gate voltage needed to modulate the source-drain current is due to the relatively thick, 200 nm $SiO_x$ gate dielectric layer.

Many embodiments of the invention include the use of a transparent substrate and a transparent gate electrode. Use of an electroluminescent semiconductor, and a low work function cathode permits the device to function as a gate-voltage modulated light emitting diode. Suitable transparent substrates include glass and plastic substrates, for example. Suitable transparent gate electrodes include transparent conducting oxides such as indium tin oxide or transparent nanotube films, such as described in the '546 application, for example. The electroluminescent semiconducting material can be in the form of a polymer, an organic molecule, or a conventional solid state semiconductor such as GaN, for example.

The work function of atmosphere exposed and/or acid purified carbon nanotubes places their Fermi level near −5 eV. Because this energy lies closer to the hole band, or HOMO, of most electroluminescent (EL) materials, embodiments of the invention are readily prepared where the dilute network is made from such nanotubes that provide hole injection into those materials. The gate field in the device of FIG. 1 thus modulates the barrier to hole injection between the nanotubes and the EL material. In exemplary embodiments, particularly suitable EL materials have hole bands or HOMO levels that lie near the nanotube Fermi level. For states within 1-2 eV of their intrinsic Fermi level, the nanotubes possess a low density of electronic states. This means that the nanotube Fermi level can be shifted by the electron injection or withdrawal induced by local electric fields due to the source-drain potential and by gating electric fields. Consequently, for gate induced modulation, exemplary embodiments of the device use EL materials with hole bands or HOMO levels within 1 to 2 eV of −5 eV (having HOMO levels between about −3 eV and about −7 eV).

Another consideration for the suitable electroluminescent material is that its intrinsic carrier density not be particularly large. In the case of a large intrinsic carrier density, the width of the depletion layer that makes up the barrier to hole transport between the nanotubes and the EL material is thin, while a large density of carriers causes the gate field to be screened from penetrating with appreciable depth into the EL material. These effects can make the gate modulation in the case of high-carrier-density EL materials small.

Moreover, the nanotubes can cause electrostatic screening of the gate field from the region of the EL material directly above them (on their side nearest the top contact). Such screening makes it difficult for the gate field to turn off a current channel directly above the nanotubes that is normally open. In a specific embodiment, the current channel that is normally closed via current pathways lying to the sides of the nanotubes, where the gate field has access, can be turned on. EL materials used in specific embodiments possess a HOMO that lies below the Fermi level of the nanotubes.

Suitable example EL materials include a vast number of molecular, polymeric and oligomeric pi-conjugated organic materials that have been synthesized to have HOMO energy levels that vary from as high as −4.0 eV vs. vacuum for neutral poly(3,4-ethylenedioxythiophene) (PEDOT), to as low as −6.7 eV for poly(dicyanothiophene). In many instances, the pi conjugated polymers are both photo- and electro-luminescent as illustrated by the materials in Table 1. Some embodiments of the invention incorporate EL materials having a HOMO energy range of −5.1 eV to −6.0 eV, which are considered relatively low lying HOMO materials. In these embodiments, the polymers and oligomers can be made relatively pure and air stable and the intrinsic carrier concentration are low, leading to low charge mobilities. Between −5.1 eV and −6.0 eV, there are many accessible materials; subtle changes in organic structure can allow the HOMO level to be tuned.

TABLE 1

HOMO values for a series of representative conjugated polymers and oligomers suitable for use in embodiments of the gate-voltage controlled LED.

| | |
|---|---|
| Methoxy/EtHxOxy poly(phenylene vinylene) (MEH-PPV) | −5.1 eV to −5.4 eV |
| Oxadiazole pendant poly(phenylene vinylene) | −5.3 eV |
| Oligo(9,9-di-n-octylfluorene-2,7-vinylene)s | −5.3 to −5.5 eV |
| Poly(4-4'-diphenylene diphenylvinylene) (PDPV) | −5.4 eV |
| Poly(9,9-dialkylfluorenes) | −5.6 to −5.7 eV |
| Poly(bis acetylide thiophenes) with BTD or quinoxaline | −5.5 to −5.7 eV |
| Diphenyloxadiazole pendant polystyrenes | −5.4 to −6.0 eV |

In addition to polymeric materials, there are numerous small molecule organic emitters, including metal chelates, distyrylbenzenes, and fluorescent dyes, possessing characteristics suitable for the device function in other embodiments of the invention. Representative materials and their HOMO levels are listed in Table 2.

TABLE 2

HOMO values for a series of representative small molecule organics suitable for use in embodiments of the gate-voltage controlled LED.

| | |
|---|---|
| 5,6,11,12-Tetraphenylnaphthacene | −5.4 eV |
| Bis(4',6'-Difluorophenylpyridinato)- | −5.8 eV |
| 4,9-bis-[4-(2,2-diphenyl-vinyl)-phenyl]-naphtho[2,3-c][1,2,5]thiadiazole | |
| 4,4'-Bis'2,2'-diphenylvinyl'-1,1'-spirobiphenyl | −5.9 eV |
| Fac tris(2-phenylpyridine) iridium [Ir(ppy)3] doped into a 4,4'-N,N'-dicarbazole-biphenyl | −6.3 eV |

Representative materials for the dielectric layer may include a broad range of insulating ceramics, such as $SiO_x$, $Al_2O_3$, $Si_3N_4$, $Y_2O_3$, $Ta_2O_5$, $PbTiO_x$, $AlTiO_x$, glasses organic compounds such as Parylene polymers, polystyrene, polyimide, polyvinylphenol, polymethylmethacrylate, fluoropolymers and self assembled monolayers and combinations thereof.

Representative materials for the gate electrode may include metallically doped and un-doped transparent conducting oxides such as ZnO, $In_2O_3$, $SnO_2$, CdO, doped with metals such as Al, Sn, Y, Sc and Ga and any combinations thereof. Representative materials may also include metals such as, Al, Au, Ag, Pt, Pd, Cd, Ni and Ta, as well as combinations thereof, as well as doped semiconductors such as p or n doped Si, p or n doped GaAs.

The representative materials above are representative materials for which the device can function and are, by no means, all inclusive. Specific embodiments of the invention, depending on the specific EL material used, can incorporate an electron transport layer between layers 105 and 106, and/or one or more hole transport layers between layer 104 (the nanotubes) and the EL layer 105. For embodiments incorporating hole transport layers between layer 104 and the EL layer 105, the gate field modulates hole injection into the first hole transport layer rather than into the EL layer.

Advantages provided by the gate modulated hole injection into the light emitter devices include, but are not necessarily limited to, improved lifetimes and simplified electronic drive schemes. As high drive voltage bias is detrimental to emission lifetime of LED devices due to electromigration and heating phenomena, the lowering of drive voltage bias due to gate field enhancement of the hole injection can improve lifetimes of embodiments of the subject devices of embodiments of the invention. Furthermore, gate voltage induced hole injection provides another degree of electronic control over the device operation, allowing simplification of the electronics for turning pixels on and off for display device applications according to embodiments of the invention.

Figure 7:
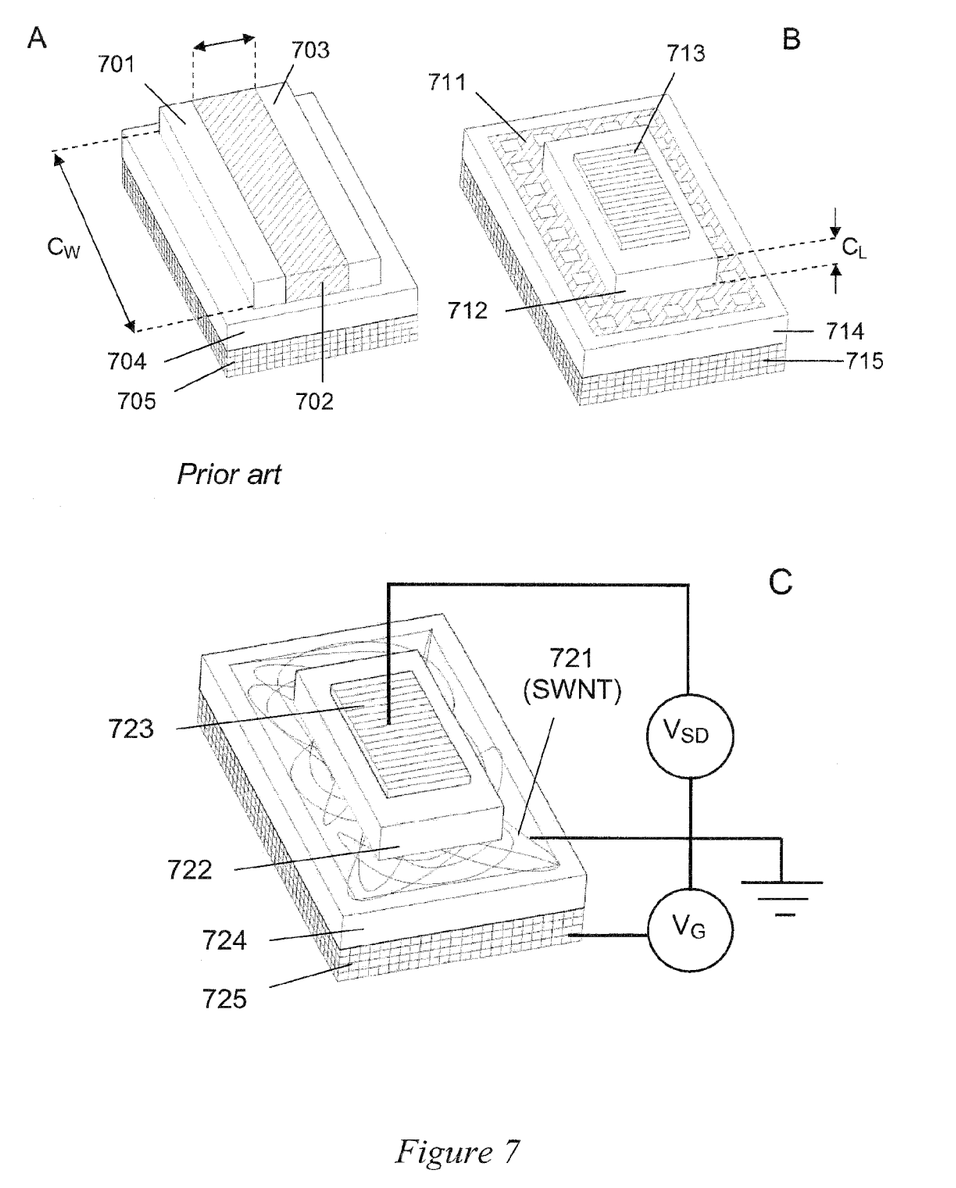
FIG. 7 shows standard prior art TFT (7A) device and a VFET (7B) device, with a specific device (7C) employing a nanotube network according to an embodiment of the invention, where the curved lines represent the percolating nanotube network, along with the wiring diagram for the device.

A TFT is a field effect transistor (FET) in which a gate field induces carriers in the active layer permitting current to flow between the source and drain electrodes. FIGS. 7A and 7B compare, in schematic form, a conventional prior art TFT and the architecture of a TFT in accordance with an embodiment of the invention. In contrast to the conventional TFT in which the source 701, active layer 702 and drain 703 are co-planar with respect to the dielectric 704 and gate 705, the architecture shown in FIG. 7B stacks the source 711, active layer 712 and drain 713 vertically relative to the gate dielectric 714 and gate electrode 715, hence the designation as a vertical field effect transistor (VFET). For the VFET architecture a continuous metal source electrode would completely screen the gate field from the active layer, hence a necessary requirement for its operation is that the source electrode be in some sense perforated, making it porous to the gate field. The source electrode 711 shown as a regular grid in FIG. 7B is meant to convey this idea but should not be taken literally. In an embodiment of the invention, illustrated in FIG. 7C, the gate-field-porous source electrode 721 is a network of single wall carbon nanotubes. Not shown is a contact pad along the periphery of the device that connects the nanotube source electrode to the power supply. The network can be a dilute layer that is well above the percolation threshold. Note that for the VFET the channel length $C_L$ is simply the active layer 722 film thickness, which can be made almost arbitrarily thin, without the need for high resolution electrode patterning for an equivalent drain 723, gate dielectric 724 and gate electrode 725.

Figure 8:
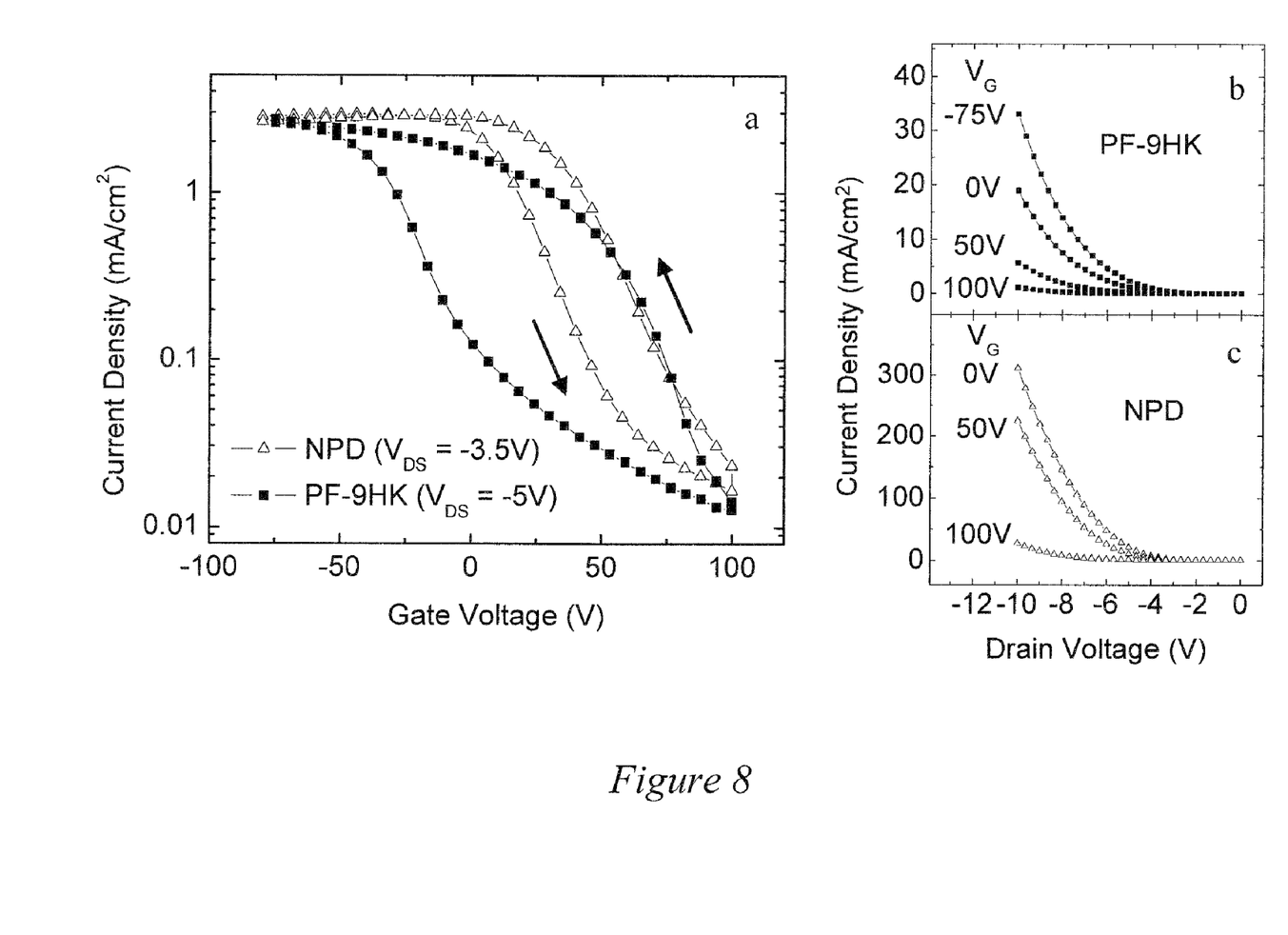
FIG. 8 shows transistor characteristics of hole only VFETs, where

FIGS. 8A and 8B show the transfer ($I_{DS}$ vs. $V_G$) and output ($I_{DS}$ vs. $V_{DS}$) curves for embodiments of the invention, illustrated in FIG. 7C, using poly[(9,9-dioctyl-fluorenyl-2,7-diyl)-alt-co-(9-hexyl-3,6-carbazole)] (PF-9HK) as the active semiconductor layer and gold as the drain electrode. Also shown in FIG. 8A is the transfer curve (output curve in FIG. 8C) for N,N'-di(1-naphthyl)-N,N'-diphenyl-1,1'-diphenyl-1,4'-diamine) (NPD) used as the active semiconductor layer. The gate voltage sweep modulates the current in both channel layers by two orders of magnitude. The large subthreshold slope is a consequence of the relatively thick $SiO_2$ gate dielectric used. In order to avoid gate leakage, a thicker dielectric layer can be used, avoiding complications regarding the device function. The device characteristics can be improved as the dielectric is made thinner. In contrast to standard FETs, where the on-current scales with the channel width (a linear dimension), current in the subject VFET scales with the overlap area between source and drain electrodes (a linear dimension squared). The on-current can also scale with the density of nanotubes in the source electrode (up to a limiting density at which the gate field begins to be screened by the nanotubes themselves).

Evident in the transfer curves in FIG. 8A is a large hysteresis, likely caused by charge traps in the active layers employed. The hysteresis is substantially smaller for the NPD device over the PF-9HK based device, indicating that the hysteresis can be reduced by modification of the active layer.

In a standard organic TFT the Fermi levels of the source and drain electrodes are selected to be closely aligned with either the highest occupied molecular orbital (HOMO) or the lowest unoccupied molecular orbital (LUMO) of the active layer material, leading to a hole carrier (p-type) or an electron carrier (n-type) device, respectively. For some nominal source-drain voltage the gate field modulates the carrier density in a thin region at the active-layer/dielectric interface, thus modulating the current that flows between the source and drain. In contrast, for embodiments of the invention, the VFET operates differently, as indicated experimentally and by theoretical modeling. While modulation of the carrier density throughout the bulk of the active layer is indicated by simulation to be possible in the VFET geometry for very thin active layers, the resulting current modulation is a steep function of the active layer thickness because carriers generated nearest the gate electrode screen the gate field from deeper regions of the active layer. For active layer thicknesses >100 nm such screening would result in only a small response of the source-drain current to the gate field. However, large modulation is observed for >100 nm active layers with only weak dependence of the gate-field lever arm on the active layer thickness. Hence, the gate induces modulation of the contact barrier between the nanotubes and the active layer. Gated nanotube networks are known to demonstrate transconductance, however, achieving appreciable current modulation across nanotube networks requires the nanotube surface density be very near the percolation limit such that the threshold percolation pathways bridge across semiconducting nanotubes (i.e., the metallic nanotubes, considered alone, must lie below the percolation threshold). When, as in many embodiments of the invention, the metallic tubes, which are typically about ⅓ of the nanotubes in the network, are above the percolation limit, the turn on of the semiconducting nanotubes can only account for about 67 percent of the modulation observed. Hence, the devices function as a p-type, Schottky barrier FET in which current modulation is due to a gate field induced modulation of the contact barrier at the nanotube/active layer interface. Modeling of the injection barrier and the effect of gate field on it indicates this is the case.

Figure 9:
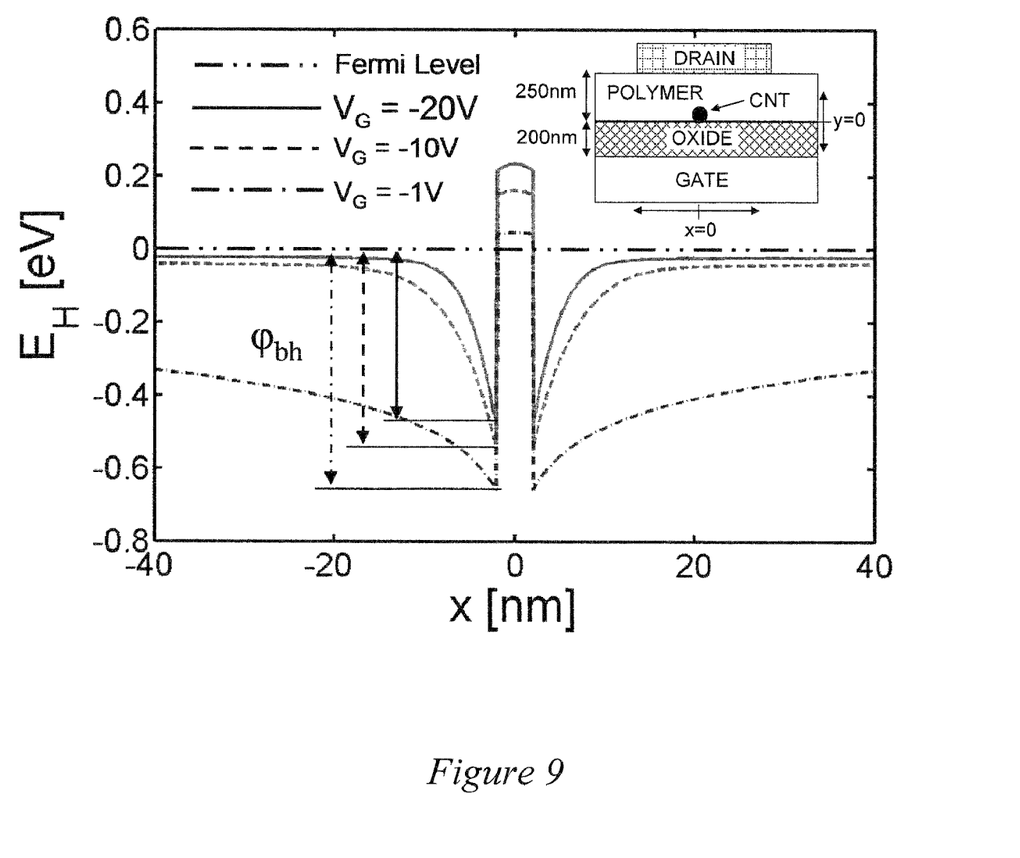
FIG. 9 shows the HOMO vs. the horizontal position x at different gate voltages, $V_G$=−1V, −10V, and −20V taken at the vertical position y=1 nm, where the interface between the gate oxide and the polymer channel is defined as y=0. The equilibrium Fermi level in both the polymer channel and the nanotube contact is $E_F$=0 (horizontal dash-dot-dot line). Vertical arrows indicate the barrier height $\phi_{bp}$ at each voltage. The nanotube diameter is 5 nm with its center located at x=0 and y=2.5 nm. The inset shows the simulated structure and the coordinates, inside the nanotube (|x|<2.5 nm) the electron potential energy (the symmetric point of the $p_z$ orbital bands) is plotted.

A two-dimensional Poisson equation was solved self-consistently with the equilibrium carrier statistics of the polymer channel and the nanotube contact for a structure as shown in the inset of FIG. 9. In order to simplify the modeling and capture the essential physics, the following conditions were considered: (i) the nanotube network is sparse so that an individual nanotube is studied for electrostatics in each region; (ii) a 2D cross-section in a vertical plane perpendicular to a nanotube long axis is simulated; and (iii) the nanotube is an individual single-walled metallic tube. A semiconducting nanotube or a small bundle has a different density of states but does not change the qualitative results. FIG. 9 shows the band bending at the nanotube/active layer interface as a function of the gate field, displaying the barrier modulation.

In embodiments of the invention, the intrinsic low density of states (DOS) for the nanotubes provides one or more advantageous features. In contrast to metals, which possess a high DOS, the Fermi level of the low DOS nanotubes can undergo an appreciable shift in response to the gate field. Hence in addition to the thinning of the contact barrier due to the gate induced band bending, the barrier height ($\phi_{bp}$) is also lowered. Literature descriptions of contact barrier modulation at metallic Schottky contacts are often casually, and incorrectly, labeled as barrier height modulation when what is really meant is barrier width modulation due to band bending. The high DOS of metals does not permit the Fermi level shift necessary for a change in the barrier height. For reference to the phenomena, a true barrier height modulation can be appreciated from the electrochemically induced barrier height modulation in an air sensitive, polymer/inorganic (poly(pyrrole)/n-indium phosphide) contact barrier disclosed in Lonergan *Science* 1997, 278, 2103, although this polymer/inorganic system is not metallic. Unlike the system of Lonergan, the nanotubes employed in the present invention are a true metallic system. Surprisingly the nanotube network based systems in embodiments of the invention exhibit this novel Schottky contact barrier modulation in a metallic air stable material. The SWNT networks described herein, which possess this low DOS can, in other embodiments of the invention, be substituted by a single graphene film, semiconducting nanowires, or conducting nanowires, where, for example the nanowires can be silicon.

For the VFET according to embodiments of the present invention, the semiconductor layer can be selected from the group consisting of: (1) at least one kind of linearly condensed polycyclic aromatic compound (acene compound) selected from the group consisting of naphthalene, anthracene, tetracene, pentacene, hexacene, and derivatives thereof; (2) at least one kind of pigment selected from the group consisting of copper-phthalocyanine (CuPc)-based compounds, azo compounds, perylene-based compounds, and derivatives thereof; (3) at least one kind of low-molecular compound selected from the group consisting of hydrazone compounds, triphenyl methane-based compounds, diphenyl-methane-based compounds, stilbene-based compounds, arylvinyl compounds, pyrazoline-based compounds, triphenyl amine derivative (TPD), arylamine compounds, low-molecular weight arylamine derivatives (a.-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB),4,4'4"-tris[N-3-methylphenyl-N-phenylamino]-triphenylamine (mMTDATA), 2,2',7,7'-tetrakis(2,2-diphenylivinyl)-9,9-spirobifluorence (Spiro-DPVBi), 4,4'-bis(2,2-diphenylvinyl)biphenyl (DPVBi), (8-quininolinolato)aluminum (Alq), tris(8-quinolinolato) aluminum ($Alq_3$), tris(4-methyl-8quinolinolato)aluminum ($Almq_3$), and derivatives thereof; and (4) at least one kind of polymer compound selected from the group consisting of poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PANT), poly(N-vinylcarbazole), halogenated poly(N-vinylcarbazole), poly(vinylpyrene), poly(vinylanthracene), poly (alkylfluorenes), pyrene-folmaldehyde resin, ethylcarbazole-folmaldehyde resin, and modifications thereof.

The gate induced band bending and barrier height modulation of nanotubes employed in embodiments of the invention is shown in FIG. 9, as simulated for a distance of 1 nm from the gate dielectric surface. The degree to which the effects occur depends on the distance from the gate. Self screening by the nanotubes reduces the gate lever arm in going from the bottom side of a nanotube, nearest the dielectric layer, to its top side. This has the implication that individual nanotubes are preferred over nanotube bundles since the top nanotubes in a bundle are screened from the gate field by underlying nanotubes and participate substantially less in the modulation. Nanotube networks in accordance with embodiments of the invention are formed by a filtration/transfer method described in Wu et al., *Science* 2004, 305, 1273, using pulsed laser vaporization grown nanotubes. All high yield nanotube synthesis methods produce bundles of varying diameter and while ultrasonication in surfactants provides a measure of bundle disassembly. AFM imaging and height analysis statistics shows these networks to be comprised of a bundle distribution ranging in diameters from 1 to 9 nm with a peak centered at ~5 nm.

In embodiments of the invention, useful active layer materials have a HOMO that lays within reach of the nanotube Fermi level for rationally applicable gate fields. If the active layer HOMO lies above the nanotube Fermi level, the gate field must generate a barrier at the accumulation layer (anti-barrier) for holes, while if the active layer HOMO lies below the nanotube Fermi level the gate must reduce the pre-existing barrier. Bundled nanotubes in the network can impose more severe constraints on the active layer materials that will yield useful transconductance. For active layers possessing a normally on (anti-barrier) band line-up, the top nanotubes in a bundle screened from the gate, cannot switch their barriers off. Because the screened nanotubes permit current flow independent of the gate field, such normally on devices cannot be turned off effectively, greatly reducing the on/off ratio. For active layers possessing a normally off band line-up, the current is switched on by the nanotubes near the bottom of the bundles. Although the top nanotubes in the bundles participate little in the switching, they do not degrade the on/off current ratio. These inferences are supported by the large on-off ratios observed for PF-9HK and NPD (HOMOs ~5.6 eV and ~5.5 eV, respectively, versus acid purified p-doped SWNT, (work function ~4.9 eV) in contrast to a poor on/off ratio that is observed with regio-regular poly(3-hexylthiophene) (HOMO ~5.0 eV) used as active layer.

In embodiments of the invention, individual (unbundled) nanotubes in the source layer can extend the range of active layers that can be used to materials having workfunctions ranging from 4 to 6 eV, which includes most electroactive polymers and inorganic active layers. Single layer graphene can be used in this application instead of the nanotubes, where the single layer graphene can be a continuous layer. The graphene layer is so thin that the change in the graphene Fermi level induced by the gate field causes the barrier height with the active layers to change.

Metals are susceptible to bond formation with active layers that possess a covalent character. Such covalent bonds are implicated in a frequently observed insensitivity of the barrier height formed to the work function difference between the metal and semiconductor (Fermi level pinning) Pristine nanotubes, by virtue of their highly passivated graphene-like surface, do not readily form covalent bonds and leaves the barrier height predisposed to gate modulation. With respect to defects on the sidewalls of nanotubes, measures can be taken to minimize or heal defects. In embodiments of the invention, an additional advantage afforded by the nanotubes are that the strength with which carbon atoms are held within the nanotube sidewall lattice is such that nanotubes are impervious to electromigration, which differs from this lifetime limiting process observed in most metal contact based electronic and electro-optic devices. Furthermore, the quasi-1D geometry of a nanotube contact results in a favorable junction electrostatics. The electric field at the surface of the nanotube is significantly enhanced due to its nanometer-scale radius that further reduces the barrier thickness to facilitate carrier injection from the nanotube contact into the active channel.

Figure 10:
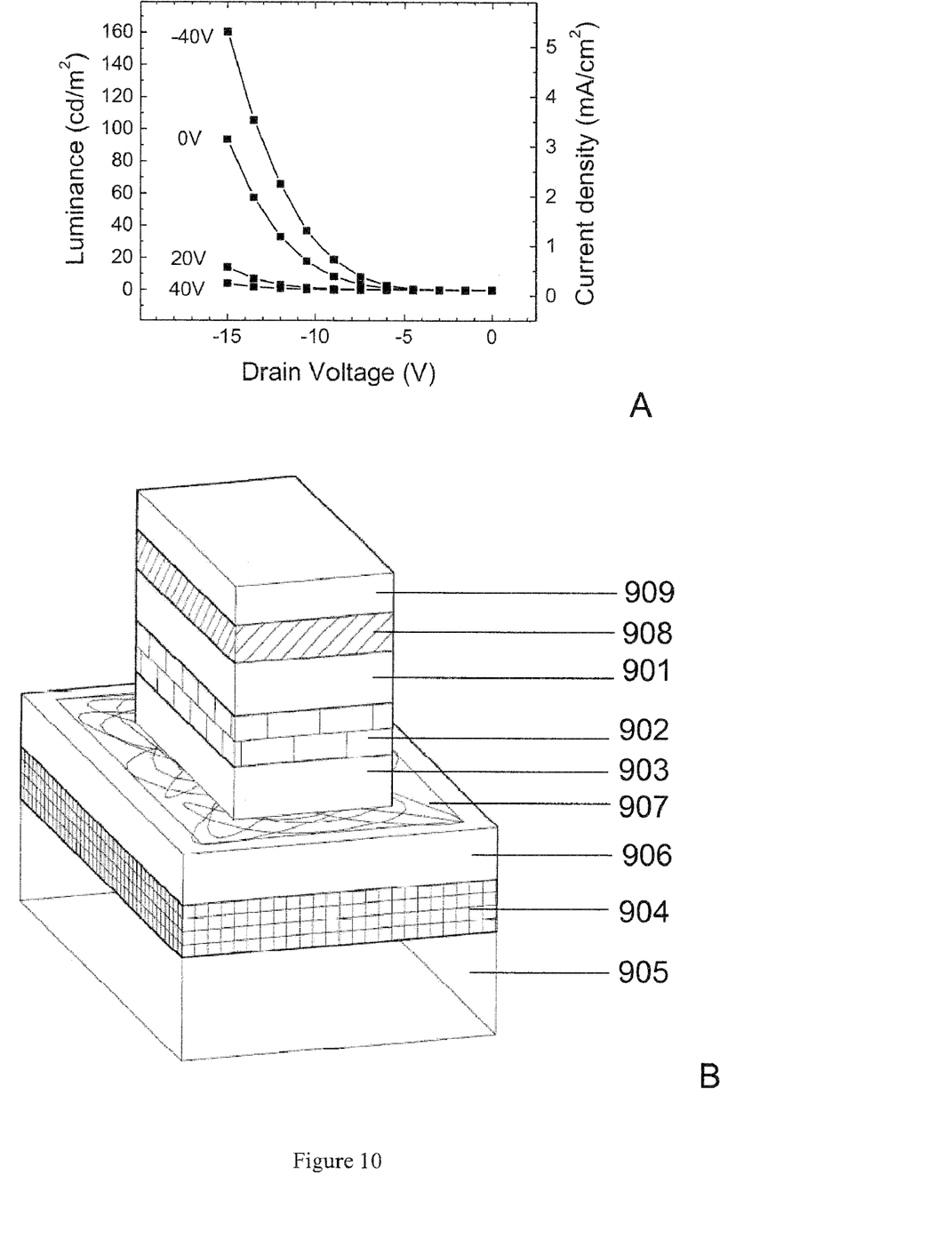
FIG. 10A shows luminance versus drain voltage at the indicated gate voltages for the VOLET stack illustrated in FIG. 10B.

PF-9HK, initially selected for its low lying HOMO, is also an electroluminescent polymer. A modification of the top contact to an electron injecting, small work function metal can create a gated, organic light emitting diode (OLED) where, for example, electrons injected from the top contact and holes from the nanotubes recombine across the polymer bandgap to produce light. Such embodiments of the invention allow control of the emitted light intensity by the applied gate voltage, which constitutes a vertical organic light emitting transistor (VOLET). To demonstrate the generality of the design, FIG. 10 shows gated light emission in a different system illustrated in FIG. 10B where: Tris (8-hydroxyquinoline) aluminum ($Alq_3$) as the photoactive layer 901, NPD as the hole transport layer 902 and PF-9HK as the gated hole injecting layer 903. For the device of FIG. 10, to permit light extraction, the gate electrode 904 is ITO on a transparent substrate 905 with a 160 nm, atomic layer deposited, aluminum-titanium oxide (ATO) gate dielectric 906, on which the nanotube network 907 is situated. For devices according to embodiments of the invention in which the NPD layer 902 directly contacted the nanotubes 907, light is initially emitted but displays a quickly decaying luminance in spite of a long term stable operation of the hole only VFETs using NPD 902 in direct contact with the nanotubes 907. In an embodiment of the invention, this lifetime issue is resolved by addition of a PF-9HK as a layer 902 that contacts the nanotubes 907. In various embodiments, intermediate layers can be used to enhance the ability to modulate the barrier. The device shown in FIG. 10B was fabricated as a hybrid polymer/small molecule device. The 200 nm PF-9HK layer 903 was spun onto the nanotubes 907 from toluene, and NPD 902 (100 nm), $Alq_3$ 903 (50 nm), LiF 908 (1 nm) and Al 909 (100 nm) layers were all thermally evaporated. A device was fabricated with a pixel of 2×2 $mm^2$. In this exemplary embodiment, because of the thinness of the nanotube source layer, at a drain voltage of −30 V, little gate modulation occurred, possible because the large source-drain voltage overcomes the major fraction of the barrier, luminance is 540 $Cd·m^{-2}$, at a current of 17.3 $mA·cm^{-2}$, which is a current efficiency of 3.1 $Cd·A^{-1}$ and is a value comparable to typical ITO anode, $NPD/Alq_3$ based devices. Bright spots in the pixel zoom were observed for the fabricated device that were likely due to particulates that underlie the nanotube network resulting in a local thinning of the source-drain channel length. This is observation was consistent with the principal failure mode of the devices being direct electrical shorts between the source-drain electrodes as the electroactive layers thinned.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:
1. A light emitting transistor, comprising:
a gate electrode for providing a gate field;
a first electrode, wherein the first electrode comprises a dilute nanotube network;
a dielectric layer interposed between the gate electrode and the first electrode,
a second electrode for injecting a complementary charge to that injected by the first electrode; and
an electroluminescent semiconductor layer disposed intermediate the first and second electrodes, wherein the complementary charges combine to produce photons and wherein charge injection between the first electrode and the electroluminescent semiconductor layer is modulated by the gate field.

2. The light emitting transistor of claim 1, wherein the nanotube network comprises carbon.

3. The light emitting transistor of claim 1, wherein the nanotube network comprises single walled carbon nanotubes.

4. The light emitting transistor of claim 1, wherein the first electrode injects holes and the second electrode injects electrons.

5. The light emitting transistor of claim 1, wherein the gate electrode is transparent.

6. The light emitting transistor of claim 3, wherein the gate electrode comprises an electrically conducting oxide.

7. The light emitting transistor of claim 4, wherein the gate electrode comprises indium tin oxide.

8. The light emitting transistor of claim 1, further comprising a transparent substrate layer disposed adjacent the gate electrode.

9. The light emitting transistor of claim 1, further comprising a protecting electrode layer disposed adjacent the second electrode.

10. The light emitting transistor of claim 1, wherein both the first and second electrodes comprise nanotube networks, each being connected to a separate power supply.

11. The light emitting transistor of claim 1, wherein the electroluminescent semiconductor layer possesses a HOMO level between about −3 eV and about −7 eV.

12. The light emitting transistor of claim 1, wherein the nanotube network comprises bundled or multiwalled nanotubes and wherein the electroluminescent semiconductor layer possesses a HOMO level less than a Fermi level of the nanotube network.

13. The light emitting transistor of claim 1, wherein the electroluminescent semiconductor layer comprises methoxy/EtHxOxy poly(phenylene vinylene) (MEH-PPV), oxadiazole pendant poly(phenylene vinylene), oligo(9,9-di-n-octylfluorene-2,7-vinylene), poly(4-4'-diphenylene diphenylvinylene) (PDPV), poly(9,9-dialkylfluorenes), poly(bis acetylide thiophenes) with BTD or quinoxaline, diphenyloxadiazole pendant polystyrene, 5,6,11,12-tetraphenyl-naphthacene, bis(4',6'-Difluorophenylpyridinato)-4,9-bis-[4-(2,2-diphenyl-vinyl)-pheny-1]-naphtho[2,3-c][1,2,5] thiadiazole, 4,4'-Bis'2,2'-diphenylvinyl'-1,1'-spirobiphenyl, or fac tris(2-phenylpyridine) iridium [Ir(ppy)3] doped into a 4,4'-N,N'-dicarbazole-biphenyl.

14. The light emitting transistor of claim 1, wherein the second electrode comprises a nanotube network, a metal film, a semiconducting film or a semiconducting nanowire film.

15. The light emitting transistor of claim 1, wherein one or more hole transport layers are disposed between the nanotube network and the electroluminescent layer.

16. The light emitting transistor of claim 1, wherein the first electrode comprises a continuous or patterned single layer of graphene.

17. The light emitting transistor of claim 1, wherein the first electrode comprises a continuous or patterned low carrier density and low density of electronic states material, wherein the first electrode does not completely screen the gate field from the electroluminescent semiconductor layer.

* * * * *